US012666879B2

(12) United States Patent
Park et al.

(10) Patent No.: US 12,666,879 B2
(45) Date of Patent: Jun. 23, 2026

(54) VARIABLE RESISTANCE MEMORY DEVICE

(71) Applicant: Samsung Electronics Co., Ltd., Suwon-si (KR)

(72) Inventors: Jinho Park, Suwon-si (KR); Hyerim Jwa, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 152 days.

(21) Appl. No.: 18/793,177

(22) Filed: Aug. 2, 2024

(65) Prior Publication Data

US 2025/0287849 A1 Sep. 11, 2025

(30) Foreign Application Priority Data

Mar. 6, 2024 (KR) ........................ 10-2024-0032181

(51) Int. Cl.
| | |
|---|---|
| *H10N 50/10* | (2023.01) |
| *G11C 11/16* | (2006.01) |
| *H10B 61/00* | (2023.01) |
| *H10N 50/80* | (2023.01) |

(52) U.S. Cl.
CPC ........... *H10N 50/10* (2023.02); *G11C 11/161* (2013.01); *H10B 61/22* (2023.02); *H10N 50/80* (2023.02); *G11C 11/1673* (2013.01); *G11C 11/1675* (2013.01)

(58) Field of Classification Search
CPC ........ H10N 50/10; H10N 50/80; H10N 50/01; G11C 11/161; G11C 11/1673; G11C 11/1675; H10B 61/22; H10B 61/00; H10B 61/20

USPC ......................................................... 365/158
See application file for complete search history.

(56) References Cited

U.S. PATENT DOCUMENTS

| | | | |
|---|---|---|---|
| 11,005,032 B2 | 5/2021 | Chuang et al. | |
| 11,121,173 B2 | 9/2021 | Dutta et al. | |
| 11,387,406 B2 | 7/2022 | Peng et al. | |
| 2018/0205010 A1* | 7/2018 | Park | H10B 61/22 |
| 2022/0238795 A1* | 7/2022 | Park | H10B 61/22 |
| 2022/0263013 A1 | 8/2022 | Chen et al. | |
| 2022/0376173 A1* | 11/2022 | Wang | H10N 50/85 |
| 2023/0023774 A1 | 1/2023 | Kim et al. | |

(Continued)

FOREIGN PATENT DOCUMENTS

KR 10-2420728 B1 7/2022

*Primary Examiner* — Amir Zarabian
(74) *Attorney, Agent, or Firm* — Fish & Richardson P.C.

(57) ABSTRACT

A variable resistance memory device includes a substrate at least partially defining a peripheral area surrounding a cell area, a lower insulating layer in the cell and peripheral areas, a magnetic tunnel junction structure in the cell area, a capping layer conformally covering both the magnetic tunnel junction structure and a first portion of the lower insulating layer in the cell area, a buried insulating layer burying the magnetic tunnel junction structure in the cell area, and an interlayer insulating layer covering a second portion of the lower insulating layer in the peripheral area. The buried and interlayer insulating layers include respective tapered contact surfaces. Respective vertical contact surfaces of the buried and interlayer insulating layers contact each other at an interface extending in the vertical direction from a top surface of the second portion of the lower insulating layer in the peripheral area to a first height.

20 Claims, 14 Drawing Sheets

(56) References Cited

U.S. PATENT DOCUMENTS

| | | | |
|---|---|---|---|
| 2023/0138005 A1 * | 5/2023 | Kao | H10B 61/22 |
| | | | 257/421 |
| 2023/0189660 A1 | 6/2023 | Dutta et al. | |
| 2023/0292528 A1 | 9/2023 | Katine et al. | |

* cited by examiner

VARIABLE RESISTANCE MEMORY DEVICE

CROSS-REFERENCE TO RELATED APPLICATION

This application is based on and claims priority under 35 U.S.C. § 119 to Korean Patent Application No. 10-2024-0032181, filed on Mar. 6, 2024, in the Korean Intellectual Property Office, the disclosure of which is incorporated by reference herein in its entirety.

BACKGROUND

The inventive concepts relate to variable resistance memory devices. More particularly, the inventive concepts relate to variable resistance memory devices including a magnetic tunnel junction structure.

With the recent high speed and low power consumption of electronic products, fast read/write operations and low operating voltages of semiconductor devices embedded in electronic products have been required. In response to this demand, highly-integrated variable resistance memory devices have emerged as next-generation memory devices because they enable high-speed read and write operations and are non-volatile. In particular, much research has been conducted on variable resistance memory devices using the magnetoresistance properties of a magnetic tunnel junction (MTJ).

SUMMARY

Some example embodiments of the inventive concepts provide a variable resistance memory device with improved reliability.

Technical problems to be solved by some example embodiments of the inventive concepts are not limited to the above-described technical problems and one of ordinary skill in the art will understand other technical problems from the following description.

According to some example embodiments of the inventive concepts, there is provided a variable resistance memory device.

According to some example embodiments of the inventive concepts, a variable resistance memory device may include a substrate at least partially defining a cell area and a peripheral area, the peripheral area surrounding the cell area. The variable resistance memory device may include a plurality of first plugs on the substrate in the cell area, the plurality of first plugs including a cell plug and a via plug, a second plug on the substrate in the peripheral area, a lower insulating layer in both the cell area and the peripheral area, the lower insulating layer covering both the plurality of first plugs and the second plug, a magnetic tunnel junction structure in the cell area and passing through the lower insulating layer to be electrically connected to the cell plug, a capping layer in the cell area, the capping layer conformally covering both the magnetic tunnel junction structure and a first portion of the lower insulating layer in the cell area, a buried insulating layer in the cell area, the buried insulating layer burying the magnetic tunnel junction structure, and an interlayer insulating layer at least partially in the peripheral area, the interlayer insulating layer covering a second portion of the lower insulating layer in the peripheral area. Respective contact surfaces of the buried insulating layer and the interlayer insulating layer may contact each other at a boundary between the cell area and the peripheral area. A contact surface of the interlayer insulating layer may include a tapered contact surface having a tapered shape at least partially defining an overall horizontal width of the interlayer insulating layer in a horizontal direction parallel an top surface of the substrate, such that the overall horizontal width of the interlayer insulating layer gradually decreases toward the substrate in a vertical direction perpendicular to the top surface of the substrate, and a contact surface of the buried insulating layer includes a separate tapered contact surface having a tapered shape at least partially defining an overall horizontal width of the buried insulating layer in the horizontal direction, such that the overall horizontal width of the buried insulating layer gradually increases toward the substrate in the vertical direction. The contact surface of the interlayer insulating layer and the contact surface of the buried insulating layer may include respective vertical contact surfaces that contact each other at an interface extending in the vertical direction from a top surface of the second portion of the lower insulating layer in the peripheral area to a first height above the top surface of the second portion of the lower insulating layer in the peripheral area.

According to some example embodiments of the inventive concepts, a variable resistance memory device may include a substrate at least partially defining a cell area and a peripheral area, the peripheral area surrounding the cell area. The variable resistance memory device may include a cell plug and a via plug on the substrate in the cell area, a peripheral plug on the substrate in the peripheral area, a lower insulating layer in both the cell area and the peripheral area, the lower insulating layer at least partially overlapping each of the cell plug, the via plug, and the peripheral plug in a vertical direction, the vertical direction perpendicular to an top surface of the substrate, a magnetic tunnel junction structure on the lower insulating layer in the cell area, the magnetic tunnel junction structure including a sequential stack of a lower electrode, a magnetic tunnel junction pattern, and an upper electrode, the magnetic tunnel junction structure passing through the lower insulating layer to be electrically connected to the cell plug, a capping layer in the cell area, the capping layer conformally covering both the magnetic tunnel junction structure and a first portion of the lower insulating layer in the cell area, a buried insulating layer in the cell area, the buried insulating layer filling a space between neighboring magnetic tunnel junction structures, and an interlayer insulating layer in the peripheral area, the interlayer insulating layer covering a second portion of the lower insulating layer in the peripheral area. The buried insulating layer and the interlayer insulating layer may contact each other at a boundary between the cell area and the peripheral area, the boundary extending in the vertical direction from a top surface of the lower insulating layer to a first height, the lower electrode having a thickness greater than or equal to the first height. The interlayer insulating layer may have a tapered shape with a horizontal width in a horizontal direction that gradually decreases toward the substrate in the vertical direction from a top surface of the interlayer insulating layer to the first height, and the buried insulating layer may have a tapered shape with a horizontal width that gradually increases toward the substrate in the vertical direction from a top surface of the buried insulating layer to the first height, the horizontal direction parallel to a top surface of the substrate.

According to some example embodiments of the inventive concepts, a variable resistance memory device may include a substrate at least partially defining a cell area and a peripheral area, the peripheral area surrounding the cell area. The variable resistance memory device may include a cell plug and a via plug on the substrate in the cell area, a peripheral plug on the substrate in the peripheral area, a lower insulating layer in both the cell area and the peripheral area, the lower insulating layer at least partially overlapping each of the cell plug, the via plug, and the peripheral plug in a vertical direction, the vertical direction perpendicular to an top surface of the substrate, a magnetic tunnel junction structure on the lower insulating layer in the cell area, the magnetic tunnel junction structure including a sequential stack of a lower electrode, a magnetic tunnel junction pattern, and an upper electrode, the magnetic tunnel junction structure passing through the lower insulating layer to be electrically connected to the cell plug, a capping layer in the cell area, the capping layer conformally covering both the magnetic tunnel junction structure and a first portion of the lower insulating layer in the cell area, a buried insulating layer, the buried insulating layer including a first buried insulating layer in the cell area and filling a space between neighboring magnetic tunnel junction structures in a horizontal direction parallel to the top surface of the substrate such that no voids are present between the neighboring magnetic tunnel junction structures in the horizontal direction, and a second buried insulating layer in the cell area, the second buried insulating layer extending in the horizontal direction, the second buried insulating layer covering both an uppermost surface of the capping layer and a top surface of the first buried insulating layer, and an interlayer insulating layer in the peripheral area, the interlayer insulating layer covering the lower insulating layer, the interlayer insulating layer formed of a material different from a material of the buried insulating layer. The buried insulating layer and the interlayer insulating layer may contact each other at a boundary between the cell area and the peripheral area, the boundary extending in the vertical direction from a top surface of the lower insulating layer to a first height, the lower electrode having a thickness greater than or equal to the first height. The interlayer insulating layer may have a tapered shape with a horizontal width that gradually decreases toward the substrate the vertical direction from a top surface of the interlayer insulating layer to the first height, and the buried insulating layer has a tapered shape with a horizontal width that gradually increases toward the substrate in the vertical direction from a top surface of the buried insulating layer to the first height.

BRIEF DESCRIPTION OF THE DRAWINGS

Some example embodiments will be more clearly understood from the following detailed description taken in conjunction with the accompanying drawings in which:

FIGS. 5, 6, 7, 8, 9, 10, 11, and 12 are cross-sectional views illustrating a method of manufacturing a variable resistance memory device according to a process order, according to some example embodiments;

DETAILED DESCRIPTION

Figure 1:
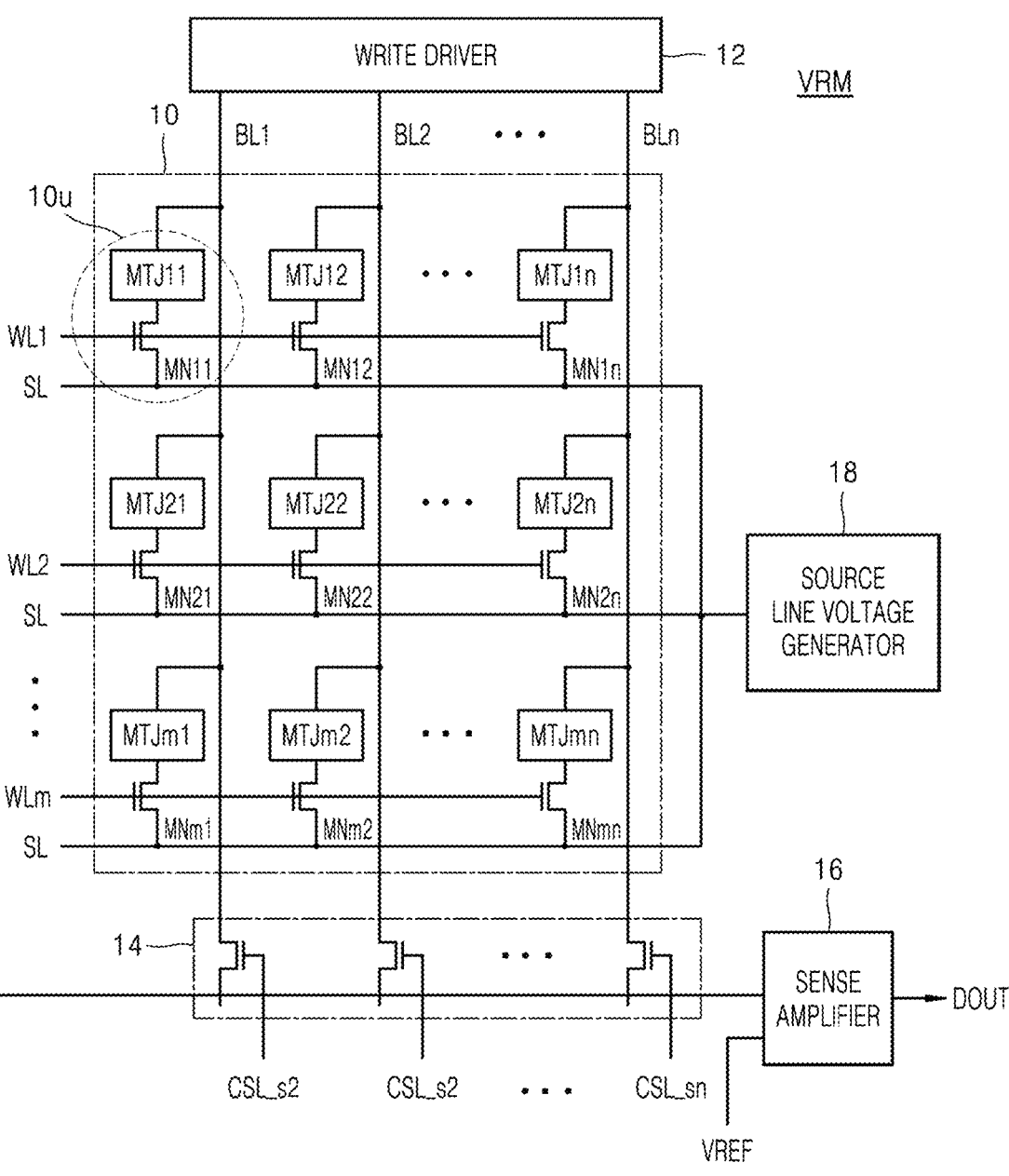
FIG. 1 is a circuit diagram illustrating a cell array of a variable resistance memory device, according to some example embodiments.

Hereinafter, some example embodiments will be described in detail with reference to the accompanying drawings. In the drawings, the same elements are denoted by the same reference numerals, and a repeated description thereof will be omitted.

Additionally, expressions written in the singular may be interpreted as singular or plural, unless explicit expressions such as "one" or "single" are used. Terms containing ordinal numbers, such as first, second, etc., may be used to describe various elements, but the elements are not limited by these terms. These terms may be used for the purpose of distinguishing one component from another.

Throughout the specification, the term "connected" does not mean only that two or more constituent components are directly connected, but may also mean that two or more constituent components are indirectly connected through another constituent component. In addition, unless explicitly described to the contrary, the word "comprise", and variations such as "comprises" or "comprising", will be understood to imply the inclusion of stated elements but not the exclusion of any other elements.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, when an element is referred to as being "above" or "on" a reference element, it can be positioned above or below or horizontally adjacent to the reference element, and it is not necessarily referred to as being positioned "above" or "on" in a direction opposite to gravity.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular", "substantially parallel", or "substantially coplanar" with regard to other elements and/or properties thereof will be understood to be "perpendicular", "parallel", or "coplanar", respectively, with regard to the other elements and/or properties thereof within manufacturing tolerances and/or material tolerances and/or have a deviation in magnitude and/or angle from "perpendicular", "parallel", or "coplanar", respectively, with regard to the other elements and/or properties thereof that is equal to or less than 10% (e.g., a. tolerance of ±10%).

It will be understood that elements and/or properties thereof may be recited herein as being "identical", "the same", or "equal" as other elements and/or properties thereof, and it will be further understood that elements and/or properties thereof recited herein as being "identical" to, "the same" as, or "equal" to other elements and/or properties thereof may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to, equal to or substantially equal to, and/or the same or substantially the same as other elements and/or properties thereof may be structurally the same or substantially the same, functionally the same or substantially the same, and/or compositionally the same or substantially the same. While the term "same," "equal" or "identical" may be used in description of some example embodiments, it should be understood that some imprecisions may exist. Thus, when one element or property is referred to as being identical to, equal to, or the same as another element or property, it should be understood that the element or property is the same as another element or property within a desired manufacturing or operational tolerance range (e.g., ±10%).

It will be understood that elements and/or properties thereof described herein as being "substantially" the same, equal, and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these numerical values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed, or an effect such as a structure is described to be established "by" or "through" performing additional operations, it will be understood that the operation may be performed and/or the effect/structure may be established "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.). Similarly, a structure described herein to be between two other structures to separate the two other structures from each other may be understood to be configured to isolate the two other structures from direct contact with each other.

As the inventive concepts allow for various changes and numerous example embodiments, some example embodiments will be illustrated in the drawings and described in the detailed description. However, this is not intended to limit the scope of the inventive concepts to particular modes of practice, and it is to be appreciated that all changes, equivalents, and substitutes that do not depart from the spirit and technical scope of the inventive concepts are encompassed in the inventive concepts. In the description of some example embodiments, certain detailed explanations of the related art are omitted when it is deemed that they may unnecessarily obscure the essence of the inventive concepts.

Figure 2:
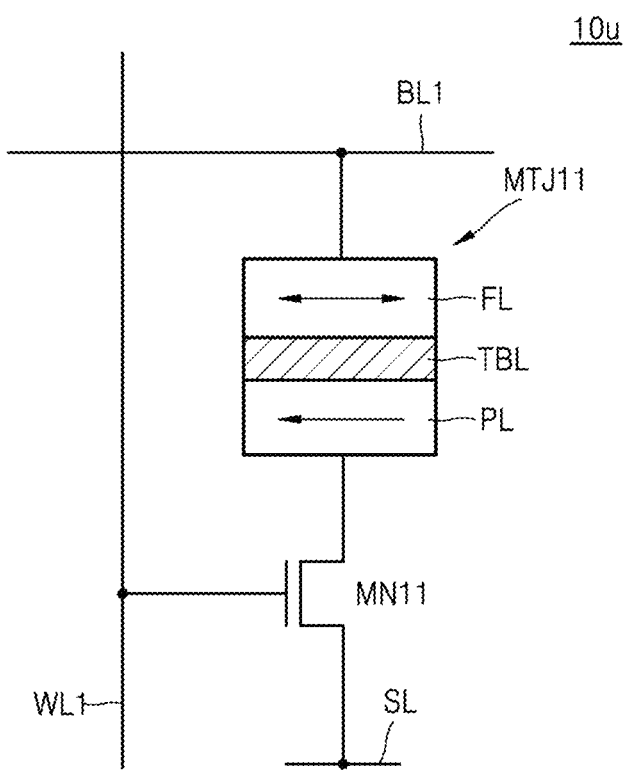
FIG. 2 is a circuit diagram illustrating a magnetoresistive memory cell of FIG. 1, according to some example embodiments.
Figure 3:
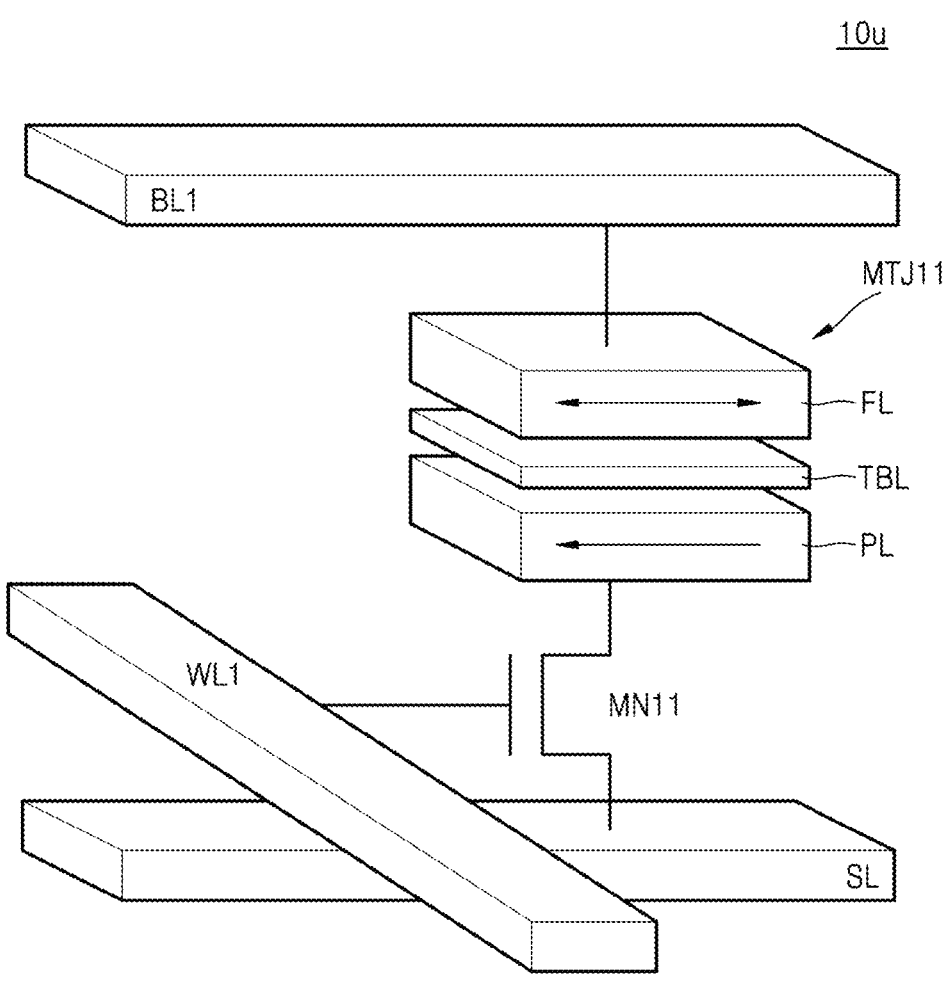
FIG. 3 is a perspective view illustrating the magnetoresistive memory cell of FIG. 2, according to some example embodiments.
Figure 4:
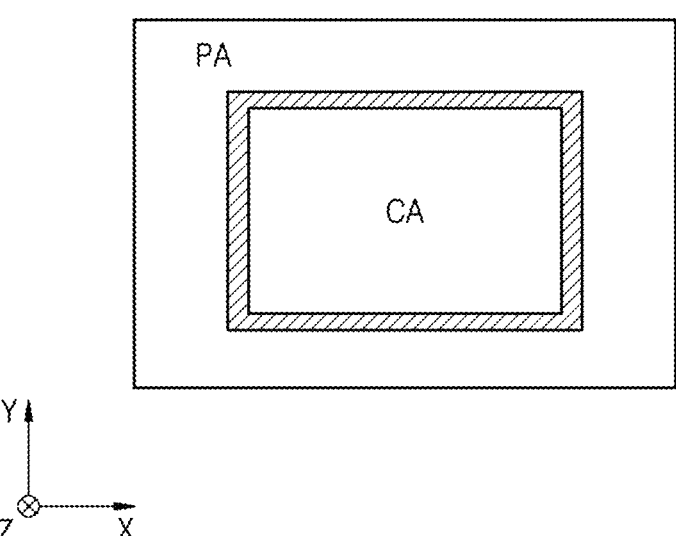
FIG. 4 is a plan view for describing a variable resistance memory device, according to some example embodiments.

FIG. 1 is a circuit diagram illustrating a cell array of a variable resistance memory device, according to some example embodiments. FIG. 2 is a circuit diagram illustrating a magnetoresistive memory cell of FIG. 1, according to some example embodiments. FIG. 3 is a perspective view illustrating the magnetoresistive memory cell of FIG. 2, according to some example embodiments. FIG. 4 is a plan view for describing a variable resistance memory device, according to some example embodiments.

Referring to FIGS. 1 to 4 together, a variable resistance memory device VRM may be a magnetoresistive memory device in some example embodiments.

As shown in FIG. 1, the magnetoresistive memory device may be a magnetoresistive random-access memory (MRAM). The variable resistance memory device VRM may include a magnetic tunnel junction (MTJ) that is a variable resistance layer.

The variable resistance memory device VRM may include a magnetoresistive memory cell array 10. The magnetoresistive memory cell array 10 may be referred to as a cell array. The magnetoresistive memory cell array 10 may be connected to a write driver 12, a selection circuit 14, a source line voltage generator 18, and a sense amplifier 16.

The magnetoresistive memory cell array 10 may include a plurality of magnetoresistive memory cells 10$u$. The magnetoresistive memory cell 10$u$ may be simply referred to as a memory cell. The magnetoresistive memory cell array 10 may include a plurality of word lines WL1 to WLm and a plurality of bit lines BL1 to BLn (n and m each independently being any positive integer). The magnetoresistive memory cell array 10 may include the magnetoresistive memory cell 10$u$ between each of the plurality of word lines WL1 to WLm and each of the plurality of bit lines BL1 to BLn.

The magnetoresistive memory cell array 10 may include a plurality of cell transistors MN11 to MNmn including respective gates connected to separate, respective word lines of the plurality of word lines WL1 to WLm, and a plurality of magnetic tunnel junctions MTJ11 to MTJmn each connected between a separate cell transistor of the plurality of cell transistors MN11 to MNmn and a bit line of the plurality of bit lines BL1 to BLn to at least partially comprise a variable resistance layer.

The write driver 12 may be connected to the plurality of bit lines BL1 to BLn. The write driver 12 may generate a program current based on write data, and the write driver 12 may provide the program current to the plurality of bit lines BL1 to BLn.

The selection circuit 14 may selectively connect the plurality of bit lines BL1 to BLn to the sense amplifier 16 in response to a plurality of column selection signals CSL_s1 to CSL_sn. The sense amplifier 16 may generate output data DOUT by amplifying a difference between an output voltage signal of the selection circuit 14 and a reference voltage VREF.

Sources (e.g., respective sources) of the plurality of cell transistors MN11 to MNmn may be connected to a source line SL. In order to magnetize the plurality of magnetic tunnel junctions MTJ11 to MTJmn in the magnetoresistive memory cell array 10, a voltage higher than a voltage applied to the plurality of bit lines BL1 to BLn may be applied to the source line SL. The source line voltage generator 18 may generate a source line driving voltage VSL and may provide the source line driving voltage VSL to the source line SL of the magnetoresistive memory cell array 10.

As shown in FIG. 2 and FIG. 3, the magnetoresistive memory cell 10u may include, for example, the cell transistor MN11, which is an NMOS transistor, and a magnetic tunnel junction MTJ11. The cell transistor MN11 includes a gate connected to the word line WL1 and a source connected to the source line SL. The magnetic tunnel junction MTJ11 is connected between a drain of the cell transistor MN11 and the bit line BL1.

As shown in FIG. 2 and FIG. 3, the magnetic tunnel junction MTJ11 may include a fixed layer PL having a fixed constant magnetization direction, a free layer FL magnetized in a direction of a magnetic field applied from the outside, and a tunnel barrier layer TBL formed as an insulating layer between the fixed layer PL and the free layer FL.

In some example embodiments, the fixed layer PL may include at least one of iron manganese (FeMn), iridium manganese (IrMn), platinum manganese (PtMn), manganese oxide (MnO), manganese sulfide (MnS), manganese tellurium (MnTe), manganese fluoride (MnF$_2$), iron fluoride (FeF$_2$), iron chloride (FeCl$_2$), iron oxide (FeO), cobalt chloride (CoCl$_2$), cobalt oxide (CoO), nickel chloride (NiCl$_2$), nickel oxide (NiO), chromium (Cr), iron (Fe), nickel (Ni), cobalt (Co), ruthenium (Ru), iridium (Ir), or rhodium (Rh).

In some example embodiments, the free layer FL may be a ferromagnetic material including at least one of iron (Fe), nickel (Ni), or cobalt (Co).

In some example embodiments, the tunnel barrier layer TBL may include aluminum oxide (AlO) or magnesium oxide (MgO).

The magnetic tunnel junction MTJ11 may be included in a memory cell at least partially comprising a spin transfer torque (STT)-MRAM.

For a write operation of the STT-MRAM, a logic-high voltage may be applied to the word line WL1 to turn on the cell transistor MN11, and write current may be applied between the bit line BL1 and the source line SL.

For a read operation of the STT-MRAM, a logic-high voltage may be applied to the word line WL1 to turn on the cell transistor MN11, and read current may be applied from the bit line BL1 to the source line SL to determine data stored in the magnetoresistive memory cell 10u according to a resistance value of the magnetic tunnel junction MTJ11 to the read current.

A resistance value of the magnetic tunnel junction MTJ11 varies according to a magnetization direction of the free layer FL. For example, in the magnetic tunnel junction MTJ11, a magnetization direction of the free layer FL and a magnetization direction of the fixed layer PL may be parallel to each other. In this case, the magnetic tunnel junction MTJ11 may have a low resistance value and may read data (e.g., 0). Also, the magnetic tunnel junction MTJ11 may be arranged so that a magnetization direction of the free layer FL is antiparallel to a magnetization direction of the fixed layer PL. In some example embodiments, the magnetic tunnel junction MTJ11 may have a high resistance value and may read data (e.g., 1).

Although a horizontal magnetic device in which magnetization directions of the free layer FL and the fixed layer PL of the magnetic tunnel junction MTJ11 are horizontal is illustrated, in other embodiments, a vertical magnetic device in which magnetization directions of the free layer FL and the fixed layer PL are vertical may be used.

As shown in FIG. 4, the variable resistance memory device VRM may include a cell area CA and a peripheral area PA surrounding the cell area CA. In some example embodiments, the variable resistance memory device VRM may include a boundary area between the cell area CA and the peripheral area PA.

The cell area CA may include an area where the magnetoresistive memory cell array 10 of FIG. 1 is located. Also, the cell area CA may be an area where the magnetoresistive memory cell 10u of FIGS. 1 and 2 is located.

A peripheral circuit and a peripheral transistor for controlling the magnetoresistive memory cell array 10 of the cell area CA may be located in the peripheral area PA. That is, the peripheral area PA may be an area where core/peripheral circuits are located.

FIGS. 5, 6, 7, 8, 9, 10, 11, and 12 are cross-sectional views illustrating a method of manufacturing a variable resistance memory device according to a process order, according to some example embodiments.

Figure 5:
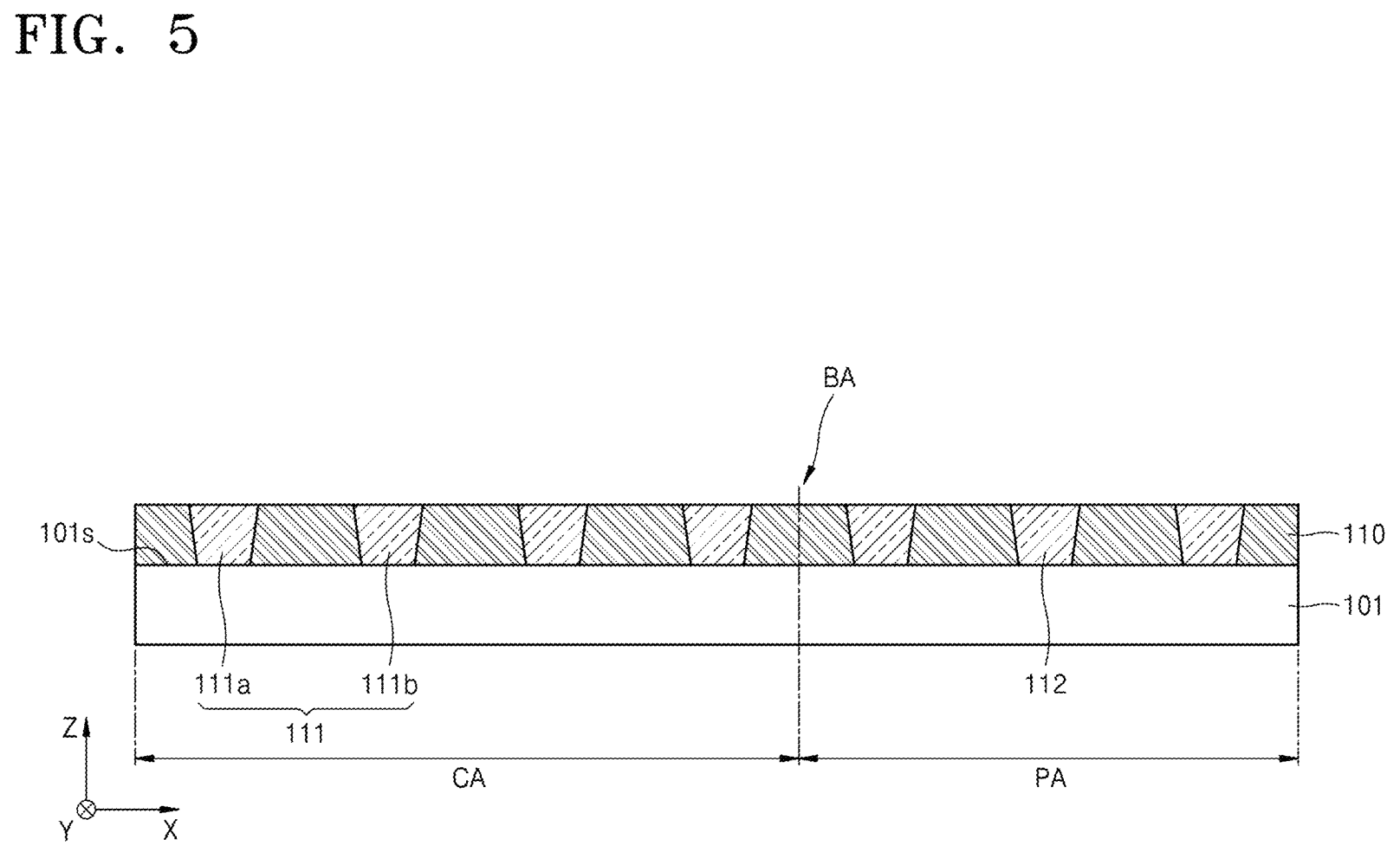

Referring to FIG. 5, a substrate 101 in which the cell area CA and the peripheral area PA are separated may be prepared. In some example embodiments, the substrate 101 may be understood to have and/or to at least partially define the cell area CA and the peripheral area PA, such that the peripheral area PA partially or entirely surrounds the cell area CA in plan view (e.g., in an XY plane extending in the X-axis and Y-axis directions).

The substrate 101 may be a semiconductor wafer including silicon (Si), germanium (Ge), silicon carbide (SiC), gallium arsenide (GaAs), indium arsenide (InAs), or indium phosphide (InP). In some example embodiments, the substrate 101 may have an impurity-doped well or an impurity-doped structure, which is a conductive region.

Although not shown, a cell transistor may be formed on the substrate 101 in the cell area CA. The cell transistor may be a buried gate-type transistor. Also, a peripheral circuit transistor may be formed on the substrate 101 in the peripheral area PA. The peripheral circuit transistor may be a planar transistor.

A base insulating layer 110 may be formed on the substrate 101, and a plurality of first plugs 111 and a plurality of second plugs 112 passing through the base insulating layer 110 may be formed.

In detail, in the cell area CA, the plurality of first plugs 111 connected to the cell transistor or connected to a lower metal line (not shown) may be formed. For example, the plurality of first plugs 111 may be formed on the substrate 101 in the cell area CA (e.g., on a portion of the substrate 101 that is in and/or at least partially defines the cell area CA). The plurality of first plugs 111 may include a cell plug 111*a* and a via plug 111*b*. The cell plug 111*a* may be connected to the cell transistor, and the via plug 111*b* may be connected to the lower metal line. Also, in the peripheral area PA, the plurality of second plugs 112 connected to the peripheral circuit transistor may be formed. For example, the plurality of second plugs 112 may be formed on the substrate 101 in the peripheral area PA (e.g., on a portion of the substrate 101 that is in and/or at least partially defines the peripheral area PA). It will be understood that an element described herein as being "in" the cell area CA or the peripheral area PA may be understood to be on a portion of the substrate 101 that is in and/or at least partially defines the cell area CA or the peripheral area PA, respectively.

Figure 6:
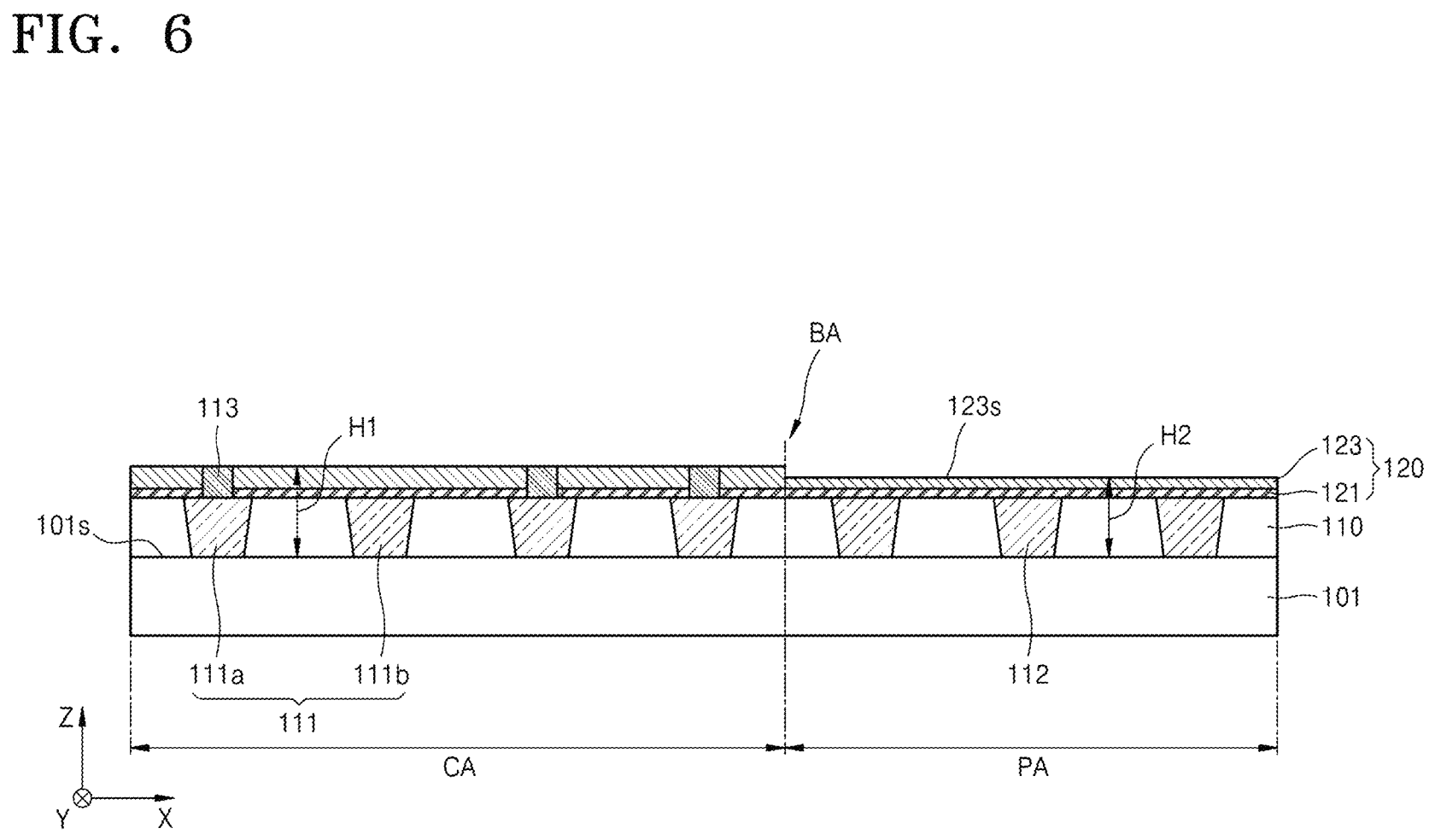

Referring to FIG. 6, over the cell area CA and the peripheral area PA, a lower insulating layer 120 covering (e.g., at least partially overlapping in the Z-axis direction) both the plurality of first plugs 111 and the plurality of second plugs 112 may be formed. The lower insulating layer 120 may be understood to extend in both the cell area CA and the peripheral area PA and thus may extend between the cell area CA and the peripheral area PA. The Z-axis direction may extend perpendicular to an in-plane direction of the substrate 101, for example perpendicular to a top surface 101*s* of the substrate 101. The X-axis direction and the Y-axis direction may each extend parallel to an in-plane direction of the substrate 101, for example parallel to the top surface 101*s* of the substrate 101, and may extend perpendicular to each other.

The lower insulating layer 120 may include a first lower insulating layer 121 and a second lower insulating layer 123 formed on the first lower insulating layer 121. The first lower insulating layer 121 and the second lower insulating layer 123 may include different materials.

In some example embodiments, the first lower insulating layer 121 may be formed of a SiCN film, a SiOC film, a SiOF film, a SiCH film, a SiOCH film, or any combination thereof.

In some example embodiments, the second lower insulating layer 123 may be formed of, but is not limited to, a tetraethoxysilane (TEOS) film.

In some example embodiments, a thickness of the second lower insulating layer 123 formed in the peripheral area PA (e.g., a thickness in the Z-axis direction) may be smaller than a thickness of the second lower insulating layer 123 formed in the cell area CA (e.g., a thickness in the Z-axis direction). That is, the second lower insulating layer 123 may have a stepped portion to have a greater height in the cell area CA than in the peripheral area PA. As a result, the height of the top surface 123*s* of the second lower insulating layer 123 may exhibit a step change from a first height H1 on the substrate 101 in the cell area CA to a second, smaller height H2 on the substrate 101 in the peripheral area PA. The step change in the height of the top surface 123*s* of the second lower insulating layer 123 may be located at the boundary BA between the cell area CA and the peripheral area PA. In some example embodiments, the stepped portion may be formed by additionally performing an etching process on the peripheral area PA.

As described herein, a "height," "level," "vertical level," or the like of an element, structure, surface, or the like may refer to a distance of the element, structure, surface, or the like from a reference location (e.g., the substrate 101, the top surface 101*s* of the substrate 101, or the like) in the Z-axis direction. Accordingly, where an element is described to have a greater or smaller height than another element, it will be understood that the element is at a greater or smaller distance in the Z-axis direction, respectively, from a reference location (e.g., the substrate 101, the top surface 101*s* of the substrate 101, etc.) than the other element.

Next, in the cell area CA, a pad electrode 113 passing (e.g., extending in the Z-axis direction) through the lower insulating layer 120 and contacting and electrically connected to a cell plug 111*a* may be formed. The pad electrode 113 may be formed only on the cell plug 111*a* from among the plurality of first plugs 111, and may not be formed on (e.g., may not overlap in the Z-axis direction) the via plug 111*b* of the plurality of first plugs 111 and may not be formed on (e.g., may not overlap in the Z-axis direction) the plurality of second plugs 112.

Figure 7:
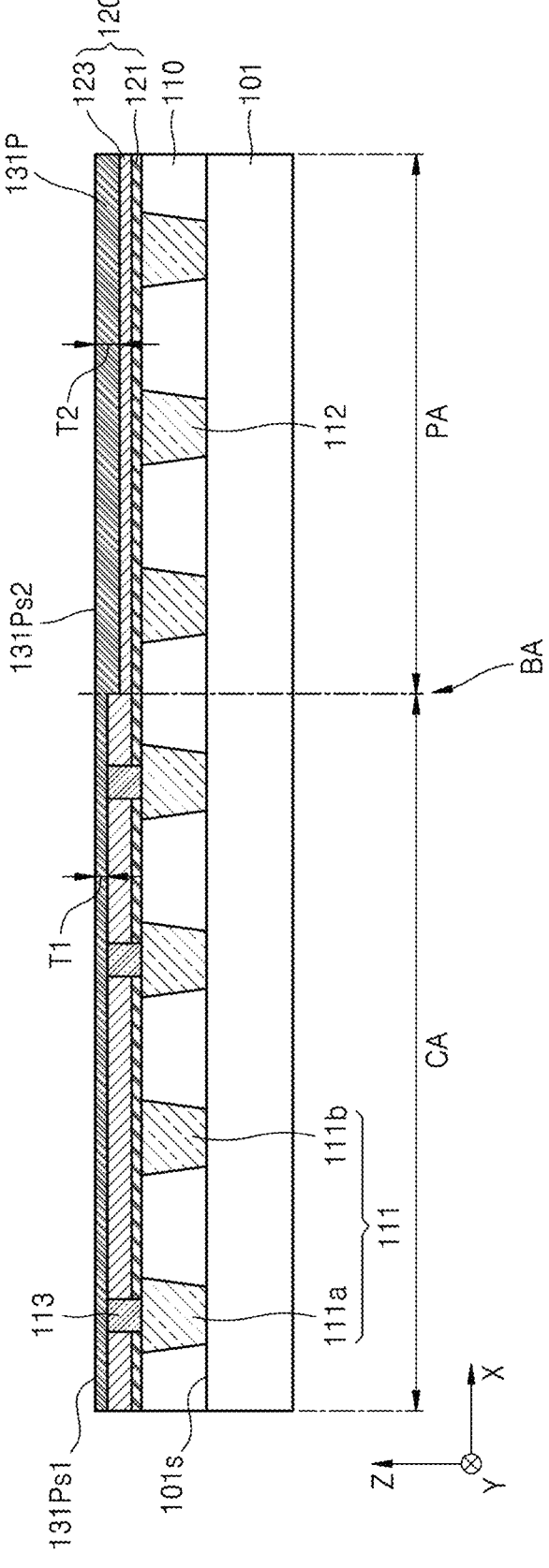

Referring to FIG. 7, a preliminary lower electrode 131P may be formed in the cell area CA and the peripheral area PA. The preliminary lower electrode 131P may be formed to cover both upper portions (e.g., top surfaces) of the cell area CA and the peripheral area PA (e.g., to cover the top surface 123*s* of the second lower insulating layer 123 in both the cell area Ca and the peripheral area PA. A top surface 131Ps1 of the preliminary lower electrode 131P in the cell area CA and a top surface 131Ps2 of the preliminary lower electrode 131P in the peripheral area PA may be at the same level (e.g., a same distance from the top surface 101*s* of the substrate 101 in the Z-axis direction, coplanar in the XY plane, etc.) due to chemical mechanical polishing. That is, due to the stepped portion (see FIG. 6) formed by a difference between a height of the second lower insulating layer 123 in the cell area CA (e.g., first height H1 shown in FIG. 6) and a height of the second lower insulating layer 123 in the peripheral area PA (e.g., second height H2 shown in FIG. 6), a thickness T1 of the preliminary lower electrode 131P in the peripheral area PA (e.g., in the Z-axis direction) may be greater than a thickness T2 of the preliminary lower electrode 131P in the cell area CA (e.g., in the Z-axis direction). In some example embodiments, the preliminary lower electrode 131P may include TiN.

Figure 8:
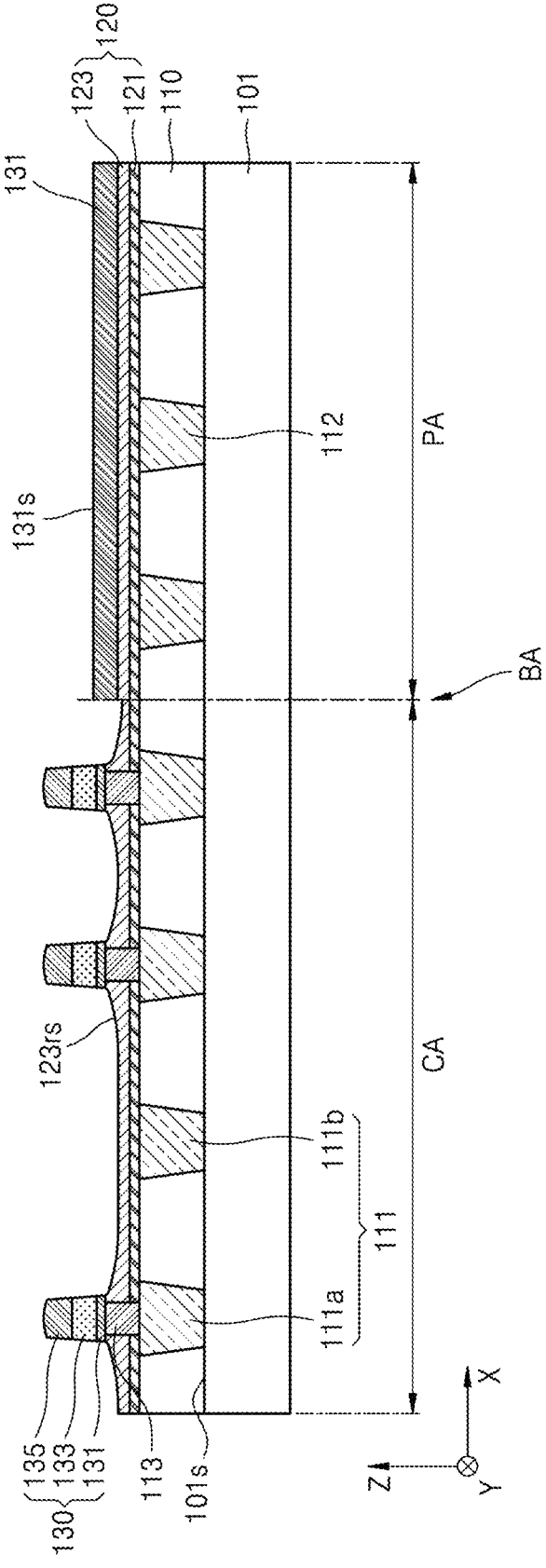

Referring to FIG. 8, in the cell area CA, a magnetic tunnel junction structure 130 including a lower electrode 131 obtained by etching a part of the preliminary lower electrode 131P and contacting and electrically connected to the pad electrode 113 may be formed.

The magnetic tunnel junction structure 130 may be located at a cross point in a mesh structure in a first direction (X direction) and a second direction (Y direction). Also, the magnetic tunnel junction structure 130 may constitute (e.g., at least partially comprise) a memory cell. The magnetic tunnel junction structure 130 may be formed on (e.g., formed only on) the cell plug 111*a* from among the plurality of first plugs 111 in the cell area CA. That is, each separate magnetic tunnel junction structure 130 may be electrically connected to a separate cell plug 111*a* from among the plurality of first plugs 111 in the cell area CA through a separate pad electrode 113. In some example embodiments, the pad electrode 113 may be considered to be part of the magnetic tunnel junction structure 130. In some example embodiments, the pad electrode 113 may be absent and/or may be a part of the lower electrode 131 as a single unitary piece of material, such that the magnetic tunnel junction structure 130 may be understood to pass through the lower insulating layer 120 (e.g., at least the lower electrode 131 may pass through the lower insulating layer 120) to be electrically connected to a cell plug 111*a*.

In some example embodiments, the magnetic tunnel junction structure 130 may have a structure in which the lower electrode 131, a magnetic tunnel junction pattern 133, and an upper electrode 135 are stacked. The magnetic tunnel junction pattern 133 may constitute a variable resistance layer and may include the fixed layer PL, the tunnel barrier layer TBL, and the free layer FL as described with reference to FIGS. 2 and 3. Each of the lower electrode 131 and the upper electrode 135 may include a metal or metal nitride.

In some example embodiments, in a process of forming the magnetic tunnel junction structure 130, a part of the second lower insulating layer 123 may also be etched so that the second lower insulating layer 123 of the cell area CA has a rounded top surface. For example, as shown in at least FIG. 8, the second lower insulating layer 123 may have a rounded top surface 123s1 having a curvature in the cell area CA and a flat top surface (e.g., a planar top surface 123s2) in the peripheral area PA.

Figure 9:
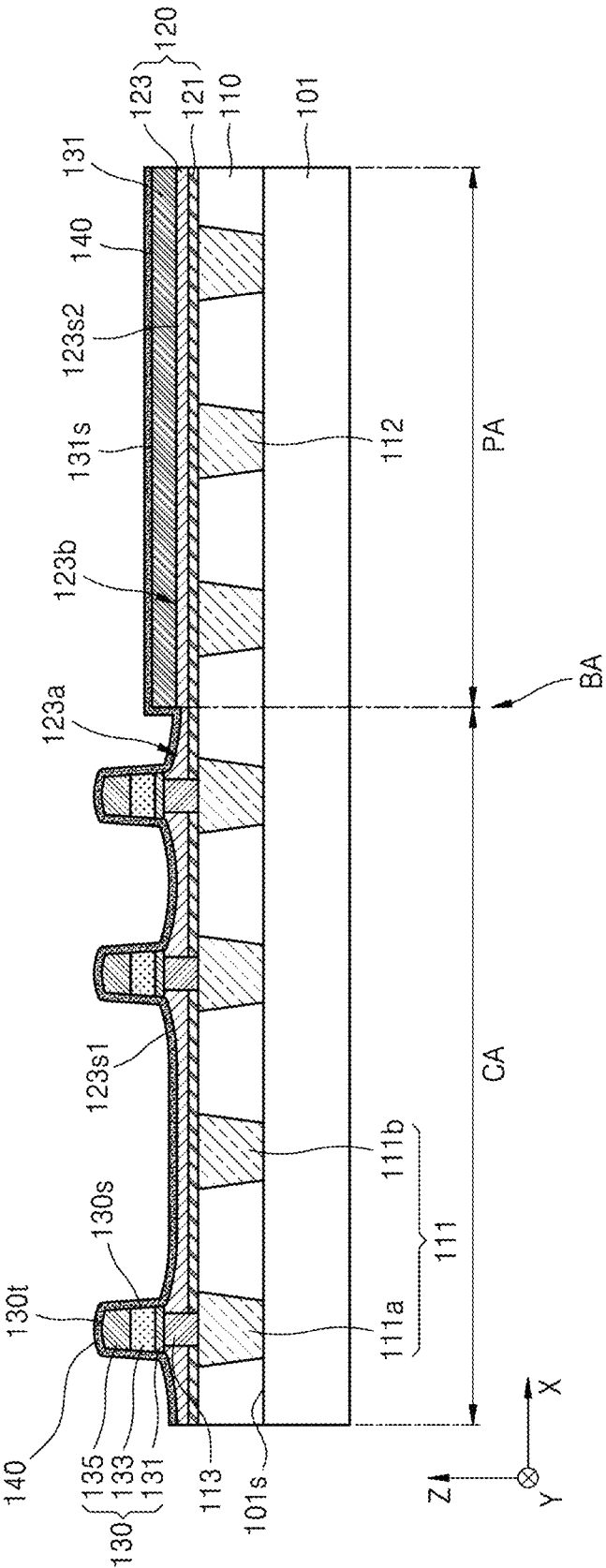

Referring to FIG. 9, over the cell area CA and the peripheral area PA, a capping layer 140 conformally covering (e.g., directly contacting and covering in the Z-axis, X-axis, and/or Y-axis directions) the entire magnetic tunnel junction structure(s) 130 and a top surface of the lower insulating layer 120 of the cell area CA (e.g., the rounded top surface 123s1 of the second lower insulating layer 123) and a top surface 131s of the lower electrode 131 in the peripheral area PA (e.g., on the substrate 101 in the peripheral area PA) may be formed. Accordingly, the capping layer 140 may be understood to conformally cover (e.g., directly contact) a first portion of the lower insulating layer 120 in the cell area CA (including, e.g., a first portion 123a of the second lower insulating layer 123) and may be indirectly on a second portion of the lower insulating layer 120 (including, e.g., a second portion 123b of the second lower insulating layer 123) in the peripheral area PA such that the lower electrode 131 in the peripheral area PA is between the capping layer 140 and the second portion of the lower insulating layer 120 in the peripheral area PA.

The capping layer 140 may be formed to protect the magnetic tunnel junction structure 130 (e.g., to isolate, encapsulate, etc. portions of the magnetic tunnel junction structure 130 that are exposed from the lower insulating layer 120 from an exterior environment). The capping layer 140 may cover both a top surface 130t and a side surface 130s of the magnetic tunnel junction structure 130 and may extend between neighboring (e.g., adjacent) magnetic tunnel junction structures 130. Accordingly, the capping layer 140 may be referred to as an encapsulation layer.

The capping layer 140 may include an insulating material. For example, the capping layer 140 may include silicon nitride (SiN).

In this case, the capping layer 140 may be continuously formed without being disconnected even at a boundary surface (e.g., at boundary BA) between the cell area CA and the peripheral area PA. That is, the capping layer 140 may be uniformly applied even at the boundary surface between the cell area CA and the peripheral area PA, and thus, the lower electrode 131 and/or the second lower insulating layer 123 of the peripheral area PA may not be exposed. For example, as shown, the capping layer 140 may extend continuously as a single unitary piece of material between neighboring, or adjacent, magnetic tunnel junction structures 130 in the cell area CA.

Figure 10:
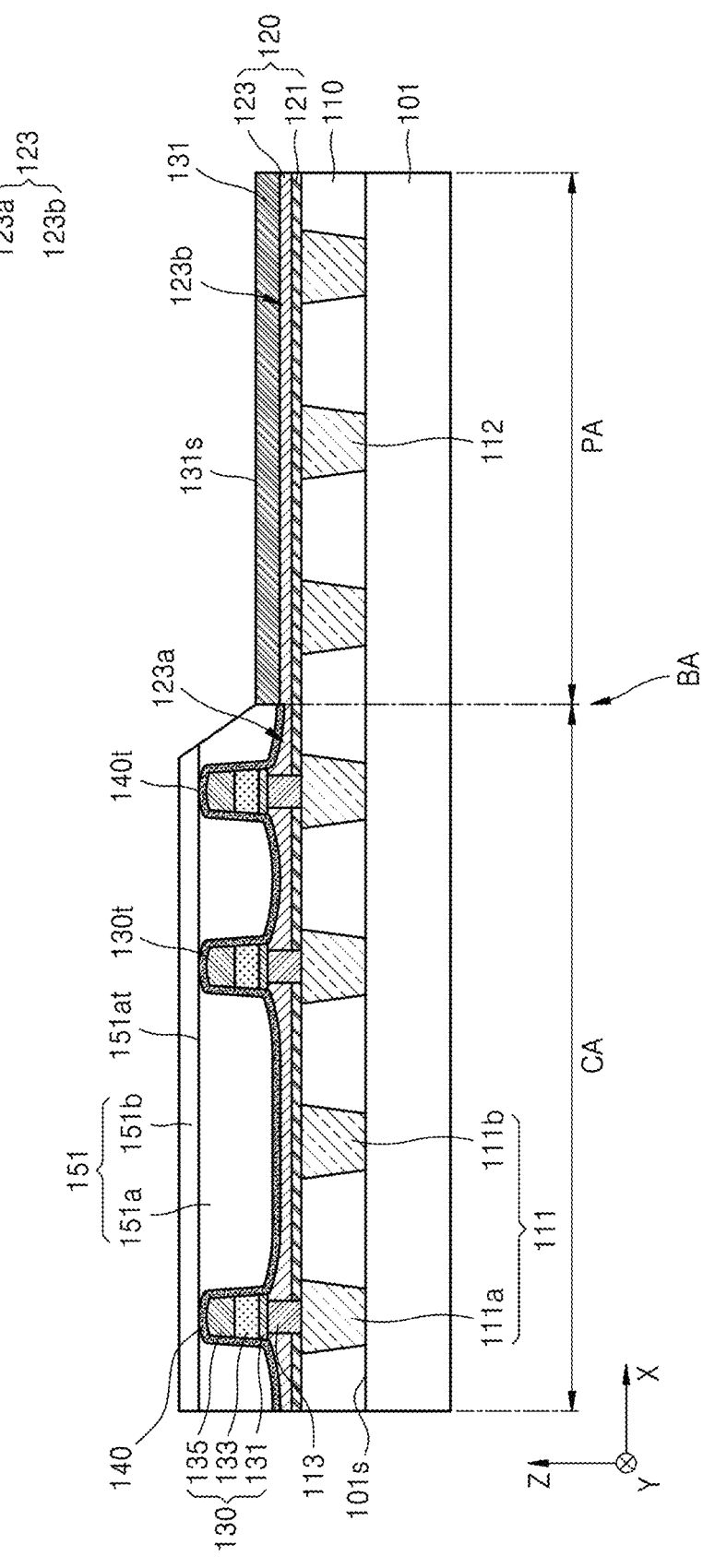

Referring to FIG. 10, over the cell area CA and the peripheral area PA, a buried insulating layer 151 may be formed, and the buried insulating layer 151 formed in the peripheral area PA may be removed. As a result, the buried insulating layer 151 may be on the capping layer 140 in the cell area CA, and the buried insulating layer 151 may be exclusively in (e.g., on) the cell area CA and may be absent from the peripheral area. For example, the buried insulating layer 151 may not be on any of the top surface 131s of the lower electrode 131 in the Z-axis direction in the peripheral area PA. In some example embodiments, the buried insulating layer 151 in the peripheral area PA may be removed by using an etch-back process. In this case, the lower electrode 131 formed in the peripheral area PA may function as an etch stop film, thereby preventing the second lower insulating layer 123 from being exposed. As shown, the buried insulating layer 151 may bury (e.g., isolate, encapsulate) the magnetic tunnel junction structure(s) 130, the capping layer 140 in the cell area CA, or the like.

The buried insulating layer 151 may include a first buried insulating layer 151a and a second buried insulating layer 151b formed on the first buried insulating layer 151a. The first buried insulating layer 151a and the second buried insulating layer 151b may include different materials such that the first buried insulating layer 151a and the second buried insulating layer 151b may have different total material compositions.

A shown in FIG. 10, In the cell area CA, the first buried insulating layer 151a may fill between the magnetic tunnel junction structures 130 (e.g., between adjacent magnetic tunnel junction structures 130 in the X-axis and/or Y-axis directions without a void. For example, the first buried insulating layer 151a may fill an entirety of the space defined between the capping layer 140 covered magnetic tunnel junction structures 130 in the X-axis and/or Y-axis directions such that there are no voids (e.g., empty spaces, comprising a gas, vacuum, or the like) between the magnetic tunnel junction structures 130 in the X-axis and/or Y-axis directions. Also, the second buried insulating layer 151b may be formed to cover (e.g., overlap in the Z-axis direction) a top surface 130t of the magnetic tunnel junction structure 130, where the top surfaces 130t of the magnetic tunnel junction structures 130 may be at least partially not overlapped in the Z-axis direction by the first buried insulating layer 151a. As shown, the second buried insulating layer 151b may be formed to conformally cover (e.g., directly contact and cover) an uppermost surface 140t of the capping layer 140 (e.g., uppermost surface of the capping layer 140 in the Z-axis direction) which may be exposed from the first buried insulating layer 151a, such that the second buried insulating layer 151b may conformally cover both the uppermost surface 140t of the capping layer 140 and a top surface 151at of the first buried insulating layer 151a.

In some example embodiments, the first buried insulating layer 151a may include, but is not limited to, silicon oxide (SiO) formed by using a high-density plasma (HDP) chemical vapor deposition process.

In some example embodiments, the second buried insulating layer 151b may be formed of a SiCN film, a SiOC film, a SiOF film, a SiCH film, a SiOCH film, or any combination thereof.

Figure 11:
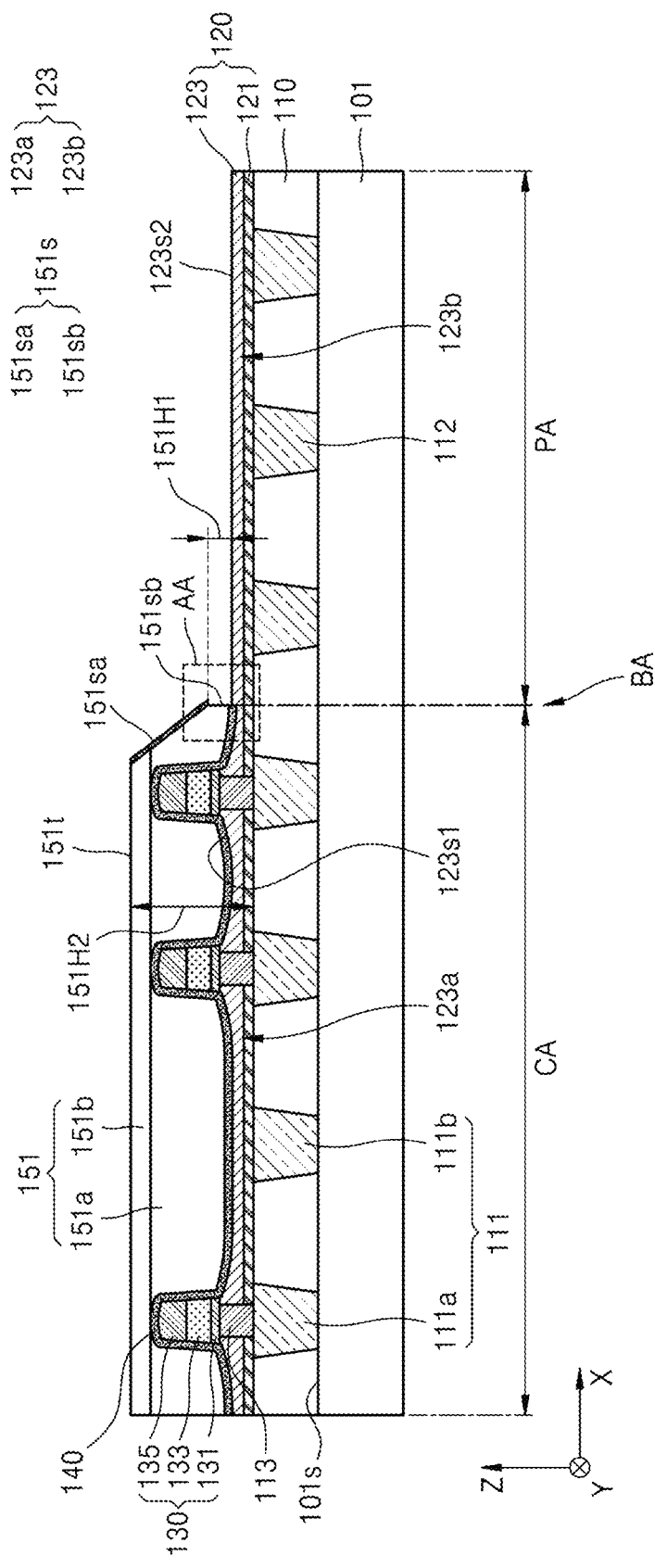

Referring to FIG. 11, the lower electrode 131 of the peripheral area PA (e.g., the lower electrode 131 in the peripheral area PA) may be removed. Through the above process, a zigzag portion may remain around a boundary between the cell area CA and the peripheral area PA (see portion AA). For example, a contact surface 151s of the buried insulating layer 151 may have a tapered contact surface 151sa (also referred to herein interchangeably as a sloped contact surface) and a vertical contact surface 151sb that collectively define a zigzag shape. In more detail, the zigzag portion may be formed because a boundary is formed (e.g., defined by the vertical contact surface 151sb) in a vertical direction (e.g., the Z-axis direction) from a top surface of the second lower insulating layer 123 (e.g., top surface 123s2) to a certain height 151H1 (e.g., a certain height above the top surface 123s2 in the Z-axis direction), but a tapered boundary is formed (e.g., defined by the tapered contact surface 151sa) from the certain height (151H1 to a height 151H2 of a top surface 151t of the buried insulating layer 151). The portion (e.g., the zigzag shape defined by the contact surface 151s) may remain by first forming the buried insulating layer 151 over the cell area CA and the peripheral area PA, removing the buried insulating layer 151 from the peripheral area PA, and then removing the lower electrode 131 (e.g., to expose the top surface 123s2 of the second portion 123b of the second lower insulating layer 123 in the peripheral area PA). In some example embodiments, the lower electrode 131 may be removed by using a strip process.

Figure 12:
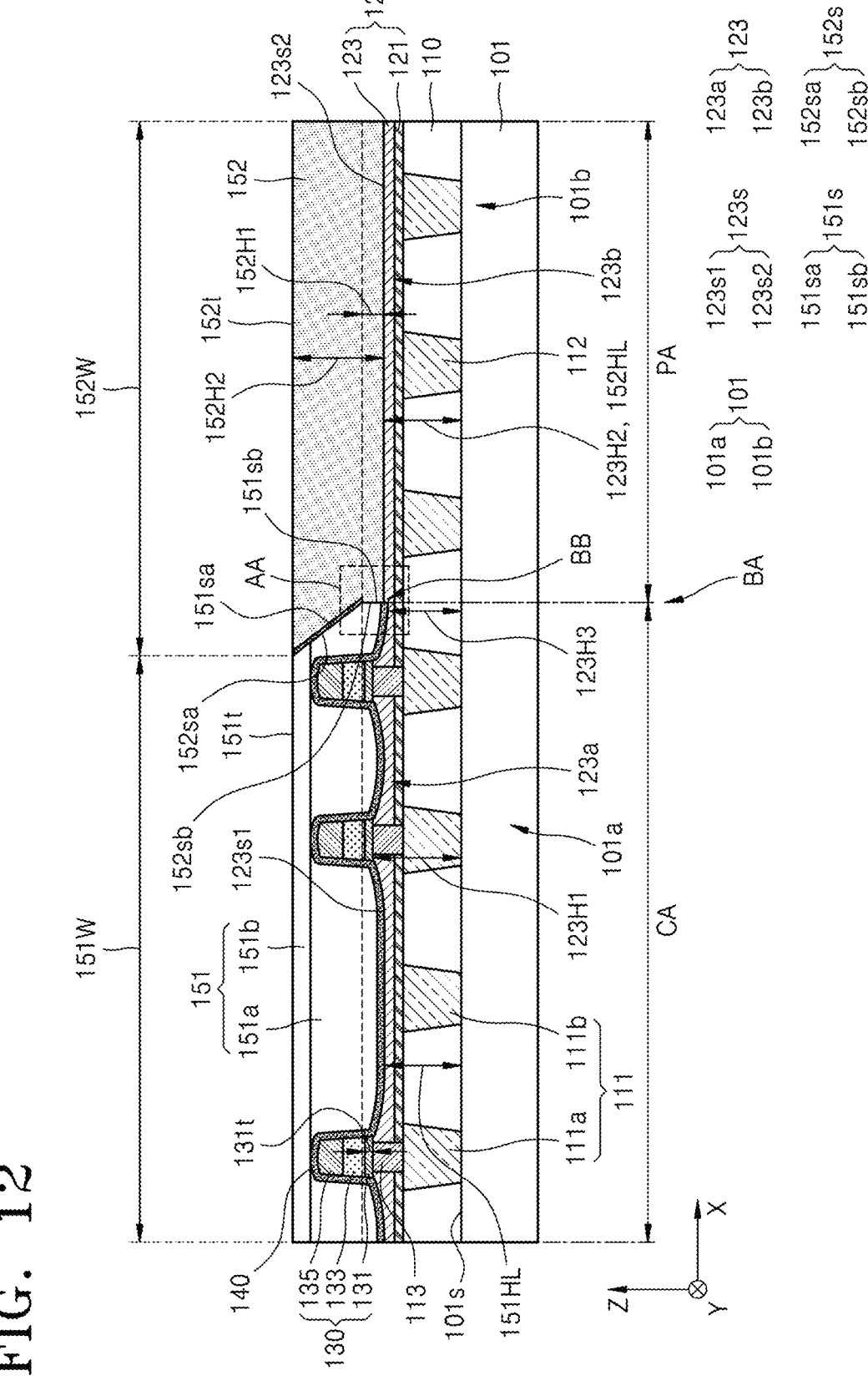

Referring to FIG. 12, in the peripheral area PA, an interlayer insulating layer 152 covering a top surface of the second lower insulating layer 123 (e.g., on at least a top surface 123s2 of the second portion 123b of the second lower insulating layer 123 in the peripheral area PA) may be formed.

The interlayer insulating layer 152 formed in the peripheral area PA may include a material different from that of the buried insulating layer 151 in the cell area CA. As a result, the interlayer insulating layer 152 and the buried insulating layer 151 may have different total material compositions.

In some example embodiments, the interlayer insulating layer 152 may be formed of a material having a low k dielectric constant that is lower than that of silicon oxide. The interlayer insulating layer 152 may include a material having a low dielectric constant of less than 3.9, for example, a low-k (LK) dielectric, an ultra low-k (ULK) dielectric, or an extreme low-k (ELK) dielectric.

Even when the interlayer insulating layer 152 is formed in the peripheral area PA, the zigzag portion around the boundary surface (e.g., the boundary BA) between the cell area CA and the peripheral area PA, defined by at least the contact surface 151s of the buried insulating layer 151 may remain as it is prior to the formation of the interlayer insulating layer 152 (see portion AA).

Ultimately, according to the inventive concepts, the lower insulating layer 120 of the peripheral area PA (e.g., the top surface 123s2 of the second portion of the second lower insulating layer 123 in the peripheral area PA) may not be exposed to the outside (e.g., an exterior environment in at least the Z-axis direction) in a process of manufacturing a variable resistance memory device by using the lower electrode 131 included in the magnetic tunnel junction structure 130 as an etch stop film in the peripheral area PA. Also, a characteristic zigzag portion, defined by the contact surface 151s (also referred to herein as an outer sidewall surface) of the buried insulating layer 151, may remain around a boundary BA between the cell area CA and the peripheral area PA by removing the lower electrode 131 before forming the interlayer insulating layer 152 in a subsequent process.

As a result, and as shown in FIG. 12, respective contact surfaces 151s and 152s (e.g., respective vertical contact surfaces 151sb and 152sb) of the buried insulating layer 151 and the interlayer insulating layer 152 contact each other at the boundary BA between the cell area CA and the peripheral area PA. As shown, a contact surface 152s (e.g., tapered contact surface 152sa) of the interlayer insulating layer 152 has a tapered shape at least partially defining an overall horizontal width 152W of the interlayer insulating layer 152 in the X-axis direction (e.g., a horizontal direction parallel to the in-plane direction of the substrate 101) to be proportional to a distance from the substrate 101 in the Z-axis direction, between a first height 152H1 and a second height 152H2 from a height of the top surface 123s2 of the second portion 123b of the second lower insulating layer 123 in the Z-axis direction, such that the overall horizontal width 152W in the X-axis direction gradually decreases toward the substrate 101 from the second height 152H2 to the first height 152H1. As shown, a contact surface 151s (e.g., tapered contact surface 151sa) of the buried insulating layer 151 has a tapered shape at least partially defining an overall horizontal width 151W of the buried insulating layer 151 in the X-axis direction to be inversely proportional to a distance from the substrate 101 in the Z-axis direction, between the first height 152H1 and the second height 152H2 from the height of the top surface 123s2 of the second portion 123b of the second lower insulating layer 123 in the Z-axis direction, such that the overall horizontal width 151W in the X-axis direction gradually increases toward the substrate 101 from the second height 152H2 to the first height 152H1. As shown, the contact surface 152s of the interlayer insulating layer 152 (e.g., the lateral contact surface 152sb) and the contact surface 151s of the buried insulating layer 151 (e.g., the vertical contact surface 151sb) contact each other and each extend in the Z-axis direction (e.g., extend vertically) so as to contact each other at an interface extending in the Z-axis direction (e.g., vertical direction) and thus to define such an interface, where such an interface extending in the Z-axis direction at which the contact surfaces 152s (e.g., 152sb) and 151s (e.g., 151sb) contact each other extends from a top surface of the second portion of the lower insulating layer 120 (e.g., a top surface 123s2 of the second portion 123b of the second lower insulating layer 123 in the peripheral area PA) to a first height 152H1 from the top surface 123s2 in the Z-axis direction.

As shown in FIG. 12, the contact surfaces 151s and 152s define a boundary (e.g., interface BB) between the interlayer insulating layer 152 and the buried insulating layer 151 that has a zigzag shape such that the boundary may include discontinuous changes in slope and/or plane defined by the contacting contact surfaces 151s and 152s along the boundary in the Z-axis direction from the top surface of the lower insulating layer 120 in the peripheral area PA (e.g., a distance in the Z-axis direction from a height of the top surface 123s2). As shown, such discontinuous changes in slope and/or plane defined by the contacting contact surfaces 151s and 152s may occur at the first height 152H1 above the top surface 123s2 of the second portion 123b of the second lower insulating layer 123.

As shown in FIG. 12, a distance in the Z-axis direction (e.g., vertical direction) from the top surface of the lower insulating layer 120 to the first height 152H1 in the peripheral area (e.g., a distance from the top surface 123s2 to the first height 152H1 in the Z-axis direction) is less than or equal to a thickness 131t of the lower electrode 131 in the Z-axis direction in the cell area CA.

In some example embodiments, where the pad electrode 113 may be absent and/or may be a part of the lower electrode 131 as a single unitary piece of material, such that the magnetic tunnel junction structure 130 may be understood to pass through the lower insulating layer 120 (e.g., at least the lower electrode 131 may pass through the lower insulating layer 120) to be electrically connected to a cell plug 111a, the thickness 131t of the lower electrode 131 in the Z-axis direction may be equal to or greater than the first height 152H1 from the top surface 123s2 in the Z-axis direction.

As shown in FIG. 12, a vertical height 123H2 (e.g., a height in the Z-axis direction above the top surface 101s of the substrate 101) of a top surface of the lower insulating layer 120 in the peripheral area PA (e.g., a height of the top surface 123s2) may be smaller than a vertical height 123H1 of an uppermost top surface of the lower insulating layer 120 in the cell area CA (e.g., a vertical height 123H1 of the uppermost portion of the top surface 123s1, for example a portion of the top surface 123s1 adjacent to a magnetic tunnelling junction structure 130 as shown).

As shown in FIG. 12, a vertical height 123H2 (e.g., a height in the Z-axis direction above the top surface 101s of the substrate 101) of a top surface of the lower insulating layer 120 in the peripheral area PA (e.g., a height of the top surface 123s2) may be greater than a vertical height 123H1 of a lowermost top surface of the lower insulating layer 120 in the cell area CA (e.g., a vertical height 123H3 of the lowermost portion of the top surface 123s1, for example a portion of the top surface 123s1 distal from a magnetic tunnelling junction structure 130 as shown, adjacent to the boundary BA, and/or between adjacent magnetic tunnelling junction structures 130 as shown).

As shown in FIG. 12, a vertical height 151HL (e.g., a height in the Z-axis direction above the top surface 101s of the substrate 101) of a lowermost surface of the buried insulating layer 151 in the cell area CA may be smaller than a vertical height 152HL of a lowermost surface of interlayer insulating layer 152 in the peripheral area PA. A shown, the vertical height 152HL may be equal to the vertical height 123H2 of the top surface of the lower insulating layer 120 in the peripheral area PA (e.g., a height of the top surface 123s2).

As shown in FIG. 12, the lower insulating layer 120 (e.g., the first portion of the lower insulating layer 120, including the first portion 123a of the second lower insulating layer 123) may be physically spaced apart (e.g., in the Z-axis direction) from the buried insulating layer 151 in the cell area CA, and the lower insulating layer 120 (e.g., the second portion of the lower insulating layer 120, including the second portion 123b of the second lower insulating layer 123) may contact the interlayer insulating layer 152 in the peripheral area PA.

As described herein, the substrate 101 may define the cell area CA and the peripheral area PA, such that the substrate 101 includes a cell area portion 101a in and/or defining the cell area CA and a peripheral area portion 101b in and/or defining the peripheral area PA. As described herein, an element, layer, or the like that is "in" a cell area CA may be interchangeably referred to as being on the substrate 101 in the cell area CA, vertically overlapping the substrate 101 in the cell area CA, on the cell area CA, vertically overlapping the cell area CA, on the cell area portion 101a of the substrate 101, vertically overlapping the cell area portion 101a of the substrate 101, or the like. As described herein, an element, layer, or the like that is "in" a peripheral area PA may be interchangeably referred to as being on the substrate 101 in the peripheral area PA, vertically overlapping the substrate 101 in the peripheral area PA, on the peripheral area PA, vertically overlapping the peripheral area PA, on the peripheral area portion 101b of the substrate 101, vertically overlapping the peripheral area portion 101b of the substrate 101, or the like.

Figure 13:
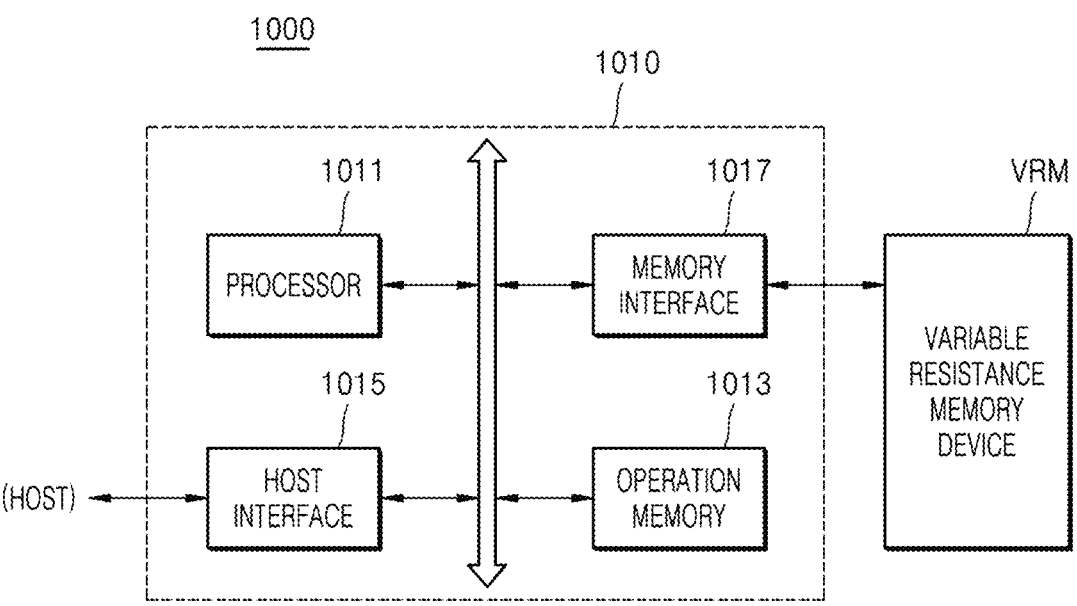
FIG. 13 is a diagram illustrating a configuration of a data processing system including a variable resistance memory device, according to some example embodiments.

FIG. 13 is a diagram illustrating a configuration of a data processing system including a variable resistance memory device, according to some example embodiments.

Referring to FIG. 13, a data processing system 1000 may include a memory controller 1010 connected between a host and the variable resistance memory device VRM. The variable resistance memory device VRM may be the variable resistance memory device according to any of the example embodiments.

The memory controller 1010 may be configured to access the variable resistance memory device VRM in response to a request of the host.

The variable resistance memory device VRM may include at least one variable resistance memory device manufactured by using the method of manufacturing a variable resistance memory device described above. The memory controller 1010 may include a processor 1011, an operation memory 1013, a host interface 1015, and a memory interface 1017.

The processor 1011 may control an overall operation of the memory controller 1010, and the operation memory 1013 may store an application, data, and a control signal required for an operation of the memory controller 1010. The host interface 1015 may perform protocol conversion for data/control signal exchange between the host and the memory controller 1010.

The memory interface 1017 may perform protocol conversion for data/control signal exchange between the memory controller 1010 and the variable resistance memory device VRM. Configuration and operation characteristics of the variable resistance memory device VRM have been described above, and thus, a detailed description thereof will be omitted.

The data processing system 1000 according to some example embodiments may be, but is not limited to, a memory card.

Figure 14:
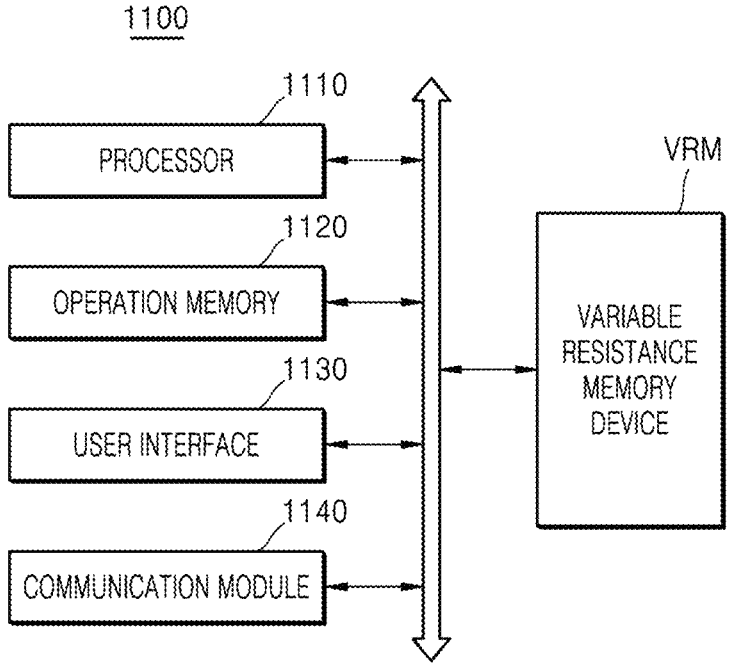
FIG. 14 is a diagram illustrating a configuration of a variable resistance memory device, according to some example embodiments.

FIG. 14 is a diagram illustrating a configuration of a data processing system including a variable resistance memory device, according to some example embodiments.

Referring to FIG. 14, a data processing system 1100 may include the variable resistance memory device VRM, a processor 1110, an operation memory 1120, and a user interface 1130 and may further include a communication module 1140 when necessary.

The variable resistance memory device VRM may be the variable resistance memory device according to any of the example embodiments. The variable resistance memory device VRM may include at least one variable resistance memory device manufactured by using the method of manufacturing a variable resistance memory device described above.

The processor 1110 may be a central processing unit. The operation memory 1120 stores an application program, data, and a control signal required for an operation of the data processing system 1100. The user interface 1130 provides an environment in which a user may access the data processing system 1100 and provides a data processing process and a data processing result of the data processing system 1100 to a user. Configuration and operation characteristics of the variable resistance memory device VRM have been described above, and thus, a detailed description thereof will be omitted.

The data processing system 1100 may be used as a disc device, used as an internal/external memory card of a portable electronic device, used as an image processor, or used as other application chipsets.

As described herein, any devices, systems, modules, portions, units, controllers, circuits, circuitry, and/or portions thereof according to any of the example embodiments, and/or any portions thereof may include, may be included in, and/or may be implemented by one or more processing devices such as hardware including logic circuits; a hardware/software combination such as a processor executing software; or a combination thereof. For example, the one or more processing devices more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the one or more processing devices may include a computer readable storage device (e.g., a memory) storing a program of instructions, for example a solid state drive (SSD), for example a non-transitory computer readable storage device, and the one or more processing devices may further include a processor (e.g., CPU) configured to execute the program of instructions to implement the functionality and/or methods performed by some or all of any devices, systems, modules, portions, units, controllers, circuits, circuitry, and/or portions thereof according to any of the example embodiments.

As described above, some example embodiments have been illustrated in the drawings and described in the specification. While some example embodiments have been described using specific terms, this is only used for the purpose of explaining the technical idea of the inventive concepts and is not used to limit the meaning and scope of the inventive concepts described in the claims. Hence, it will be understood by one of ordinary skill in the art that various modifications and other equivalent example embodiments may be made therefrom. Accordingly, the technical scope of the inventive concepts should be defined by the following claims.

While the inventive concepts have been particularly shown and described with reference to some example embodiments thereof, it will be understood that various changes in form and details may be made therein without departing from the spirit and scope of the following claims.

What is claimed is:

1. A variable resistance memory device, comprising:
a substrate at least partially defining a cell area and a peripheral area, the peripheral area surrounding the cell area;
a plurality of first plugs on the substrate in the cell area, the plurality of first plugs including a cell plug and a via plug;
a second plug on the substrate in the peripheral area;
a lower insulating layer in both the cell area and the peripheral area, the lower insulating layer covering both the plurality of first plugs and the second plug;
a magnetic tunnel junction structure in the cell area and passing through the lower insulating layer to be electrically connected to the cell plug;
a capping layer in the cell area, the capping layer conformally covering both the magnetic tunnel junction structure and a first portion of the lower insulating layer in the cell area;
a buried insulating layer in the cell area, the buried insulating layer burying the magnetic tunnel junction structure; and an interlayer insulating layer at least partially in the peripheral area, the interlayer insulating layer covering a second portion of the lower insulating layer in the peripheral area,
wherein,
respective contact surfaces of the buried insulating layer and the interlayer insulating layer contact each other at a boundary between the cell area and the peripheral area,
a contact surface of the interlayer insulating layer includes a tapered contact surface having a tapered shape at least partially defining an overall horizontal width of the interlayer insulating layer in a horizontal direction parallel an top surface of the substrate, such that the overall horizontal width of the interlayer insulating layer gradually decreases toward the substrate in a vertical direction perpendicular to the top surface of the substrate, and a contact surface of the buried insulating layer includes a separate tapered contact surface having a tapered shape at least partially defining an overall horizontal width of the buried insulating layer in the horizontal direction, such that the overall horizontal width of the buried insulating layer gradually increases toward the substrate in the vertical direction, and
the contact surface of the interlayer insulating layer and the contact surface of the buried insulating layer include respective vertical contact surfaces that contact each other at an interface extending in the vertical direction from a top surface of the second portion of the lower insulating layer in the peripheral area to a first height above the top surface of the second portion of the lower insulating layer in the peripheral area.

2. The variable resistance memory device of claim 1, wherein the boundary between the interlayer insulating layer and the buried insulating layer has a zigzag shape.

3. The variable resistance memory device of claim 1, wherein the lower insulating layer has a rounded top surface having a curvature in the cell area and has a planar top surface in the peripheral area.

4. The variable resistance memory device of claim 3, wherein a vertical height of the lower insulating layer in the peripheral area is smaller than a vertical height of an uppermost top surface of the lower insulating layer in the cell area.

5. The variable resistance memory device of claim 3, wherein a vertical height of the lower insulating layer in the peripheral area is greater than a vertical height of a lowermost top surface of the lower insulating layer in the cell area.

6. The variable resistance memory device of claim 1, wherein
the magnetic tunnel junction structure has a structure in which a lower electrode, a magnetic tunnel junction pattern, and an upper electrode are sequentially stacked in the vertical direction, and
a distance from the top surface of the lower insulating layer to the first height in the peripheral area is less than or equal to a thickness of the lower electrode in the cell area.

7. The variable resistance memory device of claim 1, wherein a vertical height of a lowermost surface of the buried insulating layer in the cell area is smaller than a vertical height of a lowermost surface of the interlayer insulating layer in the peripheral area.

8. The variable resistance memory device of claim 1, wherein the lower insulating layer is physically spaced apart from the buried insulating layer in the cell area, and the lower insulating layer contacts the interlayer insulating layer in the peripheral area.

9. The variable resistance memory device of claim 1, wherein a material of the buried insulating layer in the cell area and a material of the interlayer insulating layer in the peripheral area are different from each other.

10. The variable resistance memory device of claim 1, wherein the capping layer is a single unitary piece of material extending continuously between neighboring magnetic tunnel junction structures in the cell area.

11. The variable resistance memory device of claim 1, further comprising:

a plurality of magnetic tunnel junction structures, the plurality of magnetic tunnel junction structures including the magnetic tunnel junction structure, wherein the buried insulating layer includes a first buried insulating layer filling a space between the magnetic tunnel junction structures in the horizontal direction such that no voids are present between the magnetic tunnel junction structures in the horizontal direction, and a second buried insulating layer conformally covering both an uppermost surface of the capping layer and a top surface of the first buried insulating layer.

12. The variable resistance memory device of claim 11, wherein the first buried insulating layer and the second buried insulating layer comprise different materials.

13. A variable resistance memory device comprising:

a substrate at least partially defining a cell area and a peripheral area, the peripheral area surrounding the cell area;

a cell plug and a via plug on the substrate in the cell area;

a peripheral plug on the substrate in the peripheral area;

a lower insulating layer in both the cell area and the peripheral area, the lower insulating layer at least partially overlapping each of the cell plug, the via plug, and the peripheral plug in a vertical direction, the vertical direction perpendicular to an top surface of the substrate;

a magnetic tunnel junction structure on the lower insulating layer in the cell area, the magnetic tunnel junction structure including a sequential stack of a lower electrode, a magnetic tunnel junction pattern, and an upper electrode, the magnetic tunnel junction structure passing through the lower insulating layer to be electrically connected to the cell plug;

a capping layer in the cell area, the capping layer conformally covering both the magnetic tunnel junction structure and a first portion of the lower insulating layer in the cell area;

a buried insulating layer in the cell area, the buried insulating layer filling a space between neighboring magnetic tunnel junction structures; and an interlayer insulating layer in the peripheral area, the interlayer insulating layer covering a second portion of the lower insulating layer in the peripheral area, wherein, the buried insulating layer and the interlayer insulating layer contact each other at a boundary between the cell area and the peripheral area, the boundary extending in the vertical direction from a top surface of the lower insulating layer to a first height, the lower electrode having a thickness greater than or equal to the first height, and the interlayer insulating layer has a tapered shape with a horizontal width in a horizontal direction that gradually decreases toward the substrate in the vertical direction from a top surface of the interlayer insulating layer to the first height, and the buried insulating layer has a tapered shape with a horizontal width that gradually increases toward the substrate in the vertical direction from a top surface of the buried insulating layer to the first height, the horizontal direction parallel to a top surface of the substrate.

14. The variable resistance memory device of claim 13, wherein the lower insulating layer has a rounded top surface having a curvature in the cell area and has a planar top surface in the peripheral area.

15. The variable resistance memory device of claim 14, wherein a vertical height of the lower insulating layer in the peripheral area is smaller than a vertical height of an uppermost top surface of the lower insulating layer in the cell area, and greater than a vertical height of a lowermost top surface of the lower insulating layer in the cell area.

16. The variable resistance memory device of claim 13, wherein the lower insulating layer is physically spaced apart from the buried insulating layer in the cell area, and the lower insulating layer contacts the interlayer insulating layer in the peripheral area.

17. The variable resistance memory device of claim 13, wherein a material of the buried insulating layer in the cell area and a material of the interlayer insulating layer in the peripheral area are different from each other.

18. The variable resistance memory device of claim 13, further comprising:

a plurality of magnetic tunnel junction structures, the plurality of magnetic tunnel junction structures including the magnetic tunnel junction structure, wherein the buried insulating layer includes a first buried insulating layer filling the space between the magnetic tunnel junction structures in the horizontal direction such that no voids are present between the magnetic tunnel junction structures in the horizontal direction, and a second buried insulating layer conformally covering both an uppermost surface of the capping layer and a top surface of the first buried insulating layer, and the first buried insulating layer and the second buried insulating layer comprise different materials.

19. A variable resistance memory device, comprising:

a substrate at least partially defining a cell area and a peripheral area, the peripheral area surrounding the cell area;

a cell plug and a via plug on the substrate in the cell area;

a peripheral plug on the substrate in the peripheral area;

a lower insulating layer in both the cell area and the peripheral area, the lower insulating layer at least partially overlapping each of the cell plug, the via plug, and the peripheral plug in a vertical direction, the vertical direction perpendicular to an top surface of the substrate;

a magnetic tunnel junction structure on the lower insulating layer in the cell area, the magnetic tunnel junction structure including a sequential stack of a lower electrode, a magnetic tunnel junction pattern, and an upper electrode, the magnetic tunnel junction structure passing through the lower insulating layer to be electrically connected to the cell plug;

a capping layer in the cell area, the capping layer conformally covering both the magnetic tunnel junction structure and a first portion of the lower insulating layer in the cell area;

a buried insulating layer, the buried insulating layer including a first buried insulating layer in the cell area and filling a space between neighboring magnetic tunnel junction structures in a horizontal direction parallel to the top surface of the substrate such that no voids are present between the neighboring magnetic tunnel junction structures in the horizontal direction, and a second buried insulating layer in the cell area, the second buried insulating layer extending in the horizontal direction, the second buried insulating layer covering both an uppermost surface of the capping layer and a top surface of the first buried insulating layer; and an interlayer insulating layer in the peripheral area, the interlayer insulating layer covering the lower insulating layer, the interlayer insulating layer formed of a material different from a material of the buried insulating layer, wherein, the buried insulating layer and the interlayer insulating layer contact each other at a boundary between the cell area and the peripheral area, the boundary extending in the vertical direction from a top surface of the lower insulating layer to a first height, the lower electrode having a thickness greater than or equal to the first height, and the interlayer insulating layer has a tapered shape with a horizontal width that gradually decreases toward the substrate the vertical direction from a top surface of the interlayer insulating layer to the first height, and the buried insulating layer has a tapered shape with a horizontal width that gradually increases toward the substrate in the vertical direction from a top surface of the buried insulating layer to the first height.

20. The variable resistance memory device of claim 19, wherein the lower insulating layer has a rounded top surface having a curvature in the cell area and has a planar top surface in the peripheral area, and a vertical height of the top surface of the lower insulating layer in the peripheral area is smaller than a vertical height of an uppermost top surface of the lower insulating layer in the cell area, and greater than a vertical height of a lowermost top surface of the lower insulating layer in the cell area.

* * * * *